US009279183B2

(12) United States Patent
Endo et al.

(10) Patent No.: US 9,279,183 B2
(45) Date of Patent: Mar. 8, 2016

(54) FILM FORMING APPARATUS AND METHOD OF OPERATING THE SAME

(71) Applicant: TOKYO ELECTRON LIMITED, Tokyo (JP)

(72) Inventors: Atsushi Endo, Nirasaki (JP); Satoshi Mizunaga, Nirasaki (JP); Takehiro Otsuka, Nirasaki (JP)

(73) Assignee: TOKYO ELECTRON LIMITED (JP)

( * ) Notice: Subject to any disclaimer, the term of this patent is extended or adjusted under 35 U.S.C. 154(b) by 424 days.

(21) Appl. No.: 13/661,120

(22) Filed: Oct. 26, 2012

(65) Prior Publication Data

US 2013/0109196 A1 May 2, 2013

(30) Foreign Application Priority Data

Oct. 27, 2011 (JP) .................................. 2011-236197

(51) Int. Cl.
 *H01L 21/00* (2006.01)
 *C23C 16/44* (2006.01)
 *H01L 21/02* (2006.01)

(52) U.S. Cl.
CPC .......... *C23C 16/4404* (2013.01); *C23C 16/4405* (2013.01); *H01L 21/02115* (2013.01); *H01L 21/02271* (2013.01)

(58) Field of Classification Search
USPC .......................................... 438/105, 584, 680
See application file for complete search history.

(56) References Cited

U.S. PATENT DOCUMENTS

| 2003/0180459 | A1* | 9/2003 | Redeker et al. ............ 427/248.1 |
| 2009/0061092 | A1* | 3/2009 | Kameshima et al. .. 427/255.394 |
| 2010/0075488 | A1* | 3/2010 | Collins et al. ................. 438/507 |
| 2011/0104896 | A1* | 5/2011 | Harada et al. ................. 438/680 |

FOREIGN PATENT DOCUMENTS

| CN | 102168255 | 8/2011 |
| JP | 11330063 | 11/1999 |
| JP | 2002012972 | 1/2002 |
| JP | 2002194547 | 7/2002 |
| JP | 2007523034 | 8/2007 |
| JP | 2007525054 | 8/2007 |
| JP | 2007224383 | 9/2007 |
| JP | 2007242996 | 9/2007 |
| JP | 2009135439 | 6/2009 |
| JP | 2009246340 | 10/2009 |
| JP | 2011181903 | 9/2011 |
| KR | 1020090077873 | 7/2009 |
| TW | 200741869 | 11/2007 |

* cited by examiner

*Primary Examiner* — Julia Slutsker
(74) *Attorney, Agent, or Firm* — Cantor Colburn LLP (57) ABSTRACT

A method of operating a film forming apparatus includes forming a carbon film on each of surfaces of a plurality of objects held by a holding unit in a processing container and performing a cleaning process with a cleaning gas to remove an unnecessary carbon film adhered on a inside of the processing container, wherein the method further includes, before the forming of the carbon film, forming, on a surface of a member contacting a processing space in the processing container, a tolerant pre-coating film which has a tolerance to the cleaning gas and improves adhesion of the carbon film to the surface of the member. Accordingly, the adhesion of the carbon film is improved, and further, the tolerant pre-coating film remains even when the cleaning process of removing the unnecessary carbon film is performed.

5 Claims, 4 Drawing Sheets

FILM FORMING APPARATUS AND METHOD OF OPERATING THE SAME

CROSS-REFERENCE TO RELATED PATENT APPLICATIONS

This application claims the benefit of Japanese Patent Application No. 2011-236197, filed on Oct. 27, 2011, in the Japan Patent Office, the disclosure of which is incorporated herein in its entirety by reference.

BACKGROUND OF THE INVENTION

1. Field of the Invention

The present invention relates to a film forming apparatus for forming a carbon film on an object such as a semiconductor wafer, and a method of operating the same.

2. Description of the Related Art

Generally, in order to form an integrated circuit (IC), such as a semiconductor IC, various processes, such as a film forming process, an etching process, an oxidation diffusion process, and an annealing process, are repeatedly performed on a semiconductor wafer formed of a silicon substrate, etc. Here, according to an example of an etching process, a thin film formed of any one of various materials is conventionally used as an etching mask in order to perform a micro-size process. Recently, there are cases where a carbon film is used as an etching mask, i.e., a sacrificial film (for example, Patent Documents 1 and 2). This is because the carbon film is satisfactorily deposited even on a side wall of a recess portion of a pattern of a wafer surface, for example, in the film forming process, compared to other etching mask materials, thereby increasing a step coverage.

If the carbon film is, for example, polycrystallized and has the satisfactory step coverage as described above, the utility of the carbon film is increased under a current situation where a design rule is strict according to a further decrease of a line width or the like and the progress of miniaturization.

However, when the carbon film is to be formed on a semiconductor wafer, a material gas, for example, ethylene is introduced into a processing container formed of a quartz material under a depressurized atmosphere. Here, as a countermeasure against particles or in order to maintain the reproducibility of a film forming process, the material gas is introduced into the processing container without accommodating the wafer in the processing container before performing the film forming process, and then a carbon film is formed as a pre-coating film on an inner surface of the processing container and surfaces of members formed of a quartz material in the processing container, for example, a wafer boat holding the semiconductor wafer. After forming the pre-coating film, the semiconductor wafer is held by the wafer boat and then carried (loaded) into the processing container, and a carbon film is formed on the semiconductor wafer.

However, since the carbon film does not have a satisfactory adhesion to quartz ($SiO_2$), the pre-coating film or the carbon film deposited on the pre-coating film during the film forming process during performing the film forming process on the is semiconductor easily peels off, thereby generating particles.

(Patent Document 1) Japanese Laid-Open Patent Publication No. 2007-523034

(Patent Document 2) Japanese Laid-Open Patent Publication No. 2011-181903

SUMMARY OF THE INVENTION

The present invention provides a film forming apparatus capable of improving adhesion of a carbon film and suppressing generation of particles by forming a tolerant pre-coating film having a tolerance to a cleaning gas for removing an unnecessary carbon film to improve adhesion of a carbon film to a surface of a member contacting a processing space in a processing container, and a method of operating the film forming apparatus.

According to an aspect of the present invention, there is provided a method of operating a film forming apparatus, the method including forming a carbon film on each of surfaces of a plurality of objects held by a holding unit in a processing container and performing a cleaning process with a cleaning gas to remove an unnecessary carbon film adhered on a inside of the processing container; wherein the method further includes, before the forming of the carbon film, forming a tolerant pre-coating film having a tolerance to the cleaning gas and improving adhesion of the carbon film on surfaces of members contacting a processing space in the processing container.

According to another aspect of the present invention, there is provided a film forming apparatus which forms a carbon film on each of surfaces of a plurality of objects and performing a cleaning process to remove an adhered unnecessary carbon film, the film forming apparatus including: a vertical processing container which is configured to be capable of exhaustion; a heating unit which heats the plurality of objects; a holding unit which holds the plurality of objects and is loaded and is unloaded into and from the vertical processing container; a gas introduction unit which introduces a gas into the vertical processing container; and a control unit which controls the whole film forming apparatus to perform the method of operating the film forming apparatus above.

Additional objects and advantages of the invention will be set forth in the is description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention achieved on the basis of the findings given above will now be described with reference to the accompanying drawing. In the following description, the constituent elements having substantially the same function and arrangement are denoted by the same reference numerals, and a repetitive description will be made only when necessary.

Figure 1:
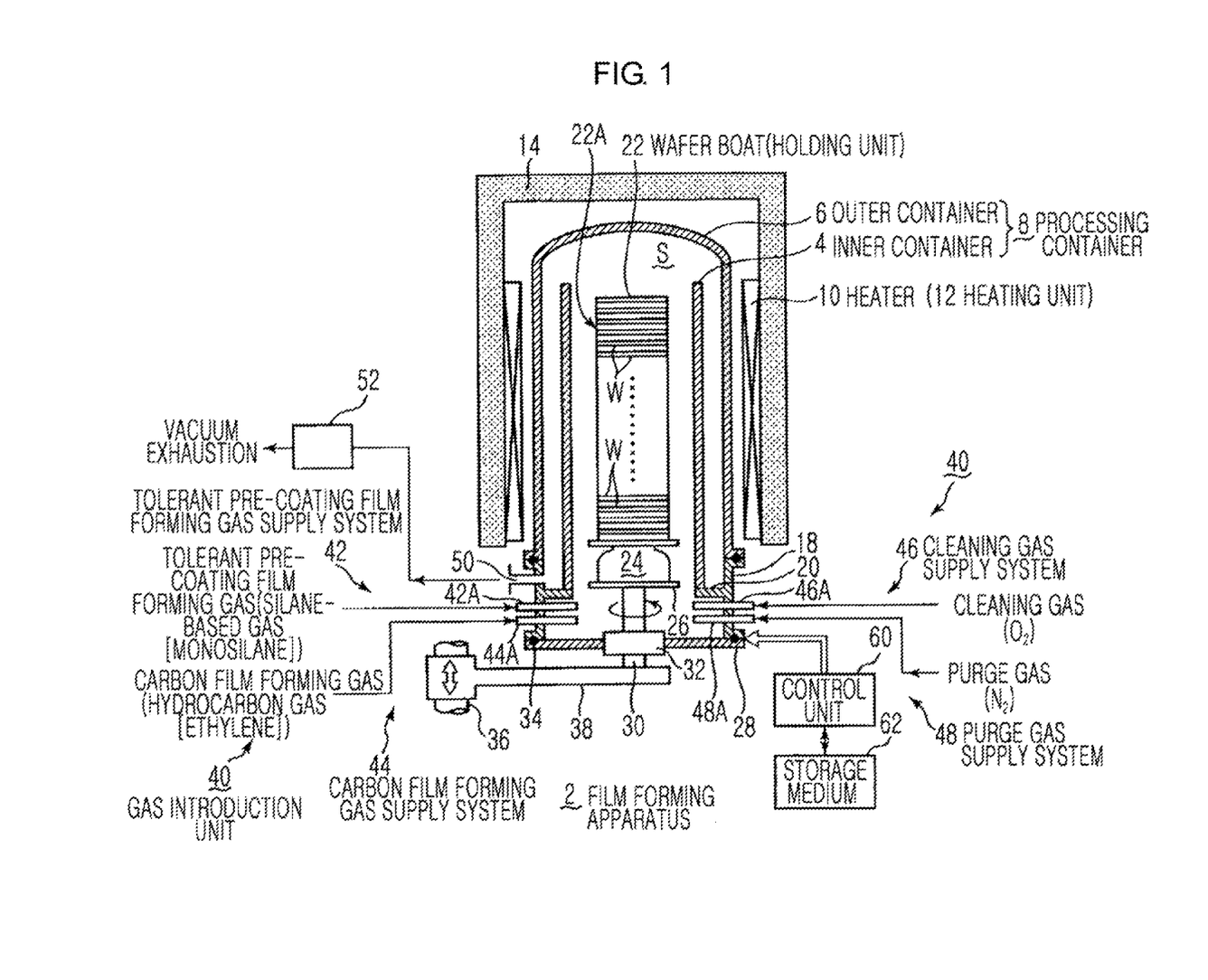
FIG. 1 is a cross-sectional view of a film forming apparatus according to an embodiment of the present invention.

Hereinafter, a film forming apparatus and a method of operating the same, according to embodiments of the present invention, will be described based on the attached drawings. FIG. 1 is a cross-sectional view of a film forming apparatus 2 is according to an embodiment of the present invention. Here, a silane-based gas, for example, monosilane, is used as a tolerant pre-coating film forming gas, a hydrocarbon gas, for example, ethylene, is used as a carbon film forming gas, and oxygen is used as a cleaning gas.

As shown in FIG. 1, the film forming apparatus 2 includes a processing container 8 having a double pipe structure. The double pipe structure includes an inner container 4 having a container body shape and formed of a quartz material and an outer container 6 having a container body shape with a roof and formed of a quartz material, wherein the outer container 6 is disposed outside the inner pipe 4 in a concentric circular shape. An outer circumference of the processing container 8 is surrounded by a heating unit 12 having a heater 10, which heats objects accommodated in the processing container 8. An inside of the outer container 6 is formed as a processing space S.

The heating unit 12 has a cylindrical body shape and surrounds almost all areas of a side surface of the processing container 8. Also, an insulation material 14 is provided at the outer circumference of the processing container 8 to completely surround side surfaces, including a roof portion, of the processing container 8. The heating unit 12 is adhered to an inner side surface of the insulation material 14.

A bottom of the processing container 8 is supported by a manifold 18 having, for example, a container body shape formed of stainless steel, and a bottom portion of the inner container 4 is supported by a support ring 20 adhered to an inner wall of the manifold 18. The manifold 18 may be formed of quartz or the like, and may be integrally molded with the processing container 8. Also, a wafer boat 22 formed of a quartz material is provided as a holding unit on which semiconductor wafers W as a plurality of objects are placed. The wafer boat 22 is freely inserted into and pulled out from (loaded into and unloaded from) the processing container 8 through the bottom of the manifold 18 and thereby being able to move up and down in the processing container 8. The semiconductor wafer W, for example, may have a diameter of 300 mm. However, a size thereof is not specifically limited. The wafer boat 22 is formed by fixing both ends in upper and lower sides of three or four supports 22A, wherein positions of the supports 22A are maldistributed in a semicircular portion of the periphery of the semiconductor wafer W, and for example, peripheral portions of the semiconductor wafers W are held by groove portions formed at predetermined pitches on the supports 22A.

The wafer boat 22 is placed on a rotating table 26 with a thermo-container 24 formed of a quartz material in between, and the rotating table 26 is supported at a top of a rotating shaft 30 penetrating through a cover unit 28 for opening and closing a bottom opening of the manifold 18. Also, for example, a magnetic fluid seal 32 is provided at a penetrating portion of the rotating shaft 30 such as to airtightly seal and rotatably support the rotating shaft 30. Also, a seal member 34 formed of an O-ring or the like is provided between a peripheral portion of the cover unit 28 and a bottom of the manifold 18 so as to hold the scalability of a container. Here, members formed of a quartz material include the wafer boat 22 and the thermo-container 24, as well as the processing container 8 including the inner container 4 and the outer container 6.

The rotating shaft 30 is adhered to a leading end of an arm 38 supported by an elevating mechanism 36, for example, a boat elevator, to integrally elevate the wafer boat 22 and the cover unit 28. A gas introduction unit 40 for introducing gases required for processes into the processing container 8 is provided at a side portion of the manifold 18. In detail, the gas introduction unit 40 includes a tolerant pre-coating film forming gas supply system 42 for supplying a tolerant pre-coating film forming gas, a carbon film forming gas supply system 44 for supplying a carbon film forming gas, a cleaning gas supply system 46 for supplying a cleaning gas, and a purge gas supply system 48 for supplying a purge gas.

The gas supply systems 42, 44, 46, and 48 respectively include gas nozzles 42A, 44A, 46A, and 48A provided by penetrating through the manifold 18, and corresponding gases are supplied from the gas nozzles 42A, 44A, 46A, and 48A as occasion demands while flow rates of the corresponding gases are controlled. Shapes of the gas nozzles are not specifically limited, and for example, a so-called distribution type nozzle extending along a height direction of the processing container 8 and including a plurality of gas ejection holes may be used.

Regarding the types of the gases used, as described above, a silane-based gas, for example, monosilane, is used as the tolerant pre-coating film forming gas, a is hydrocarbon-based gas, for example, ethylene, is used as the carbon film forming gas, oxygen or ozone is used as the cleaning gas, and nitrogen is used as the purge gas. The tolerant pre-coating film forming gas or the silane-based gas, or the cleaning gas may be introduced with a carrier gas as occasion demands.

Also, an exhaustion hole 50, which exhausts an atmosphere of the processing container 8 form between the inner container 4 and the outer container 6, is formed in a side wall of the manifold 18, and a vacuum exhaust system 52 including, for example, a vacuum pump or pressure adjusting valve (not shown), is connected to the exhaust hole 50.

All operations of the film forming apparatus 2 formed as above are controlled by a control unit 60 including, for example, a computer. The control unit 60 controls all operations of an apparatus, and computer programs performing the operations are stored in a storage medium 62, such as a flexible disc, a compact disc (CD), a hard disc, or a flash memory. In detail, starting or stopping of supply of each gas, controlling of a flow rate, controlling of a process temperature or process pressure, etc. are performed according to commands from the control unit 60.

Figure 2:
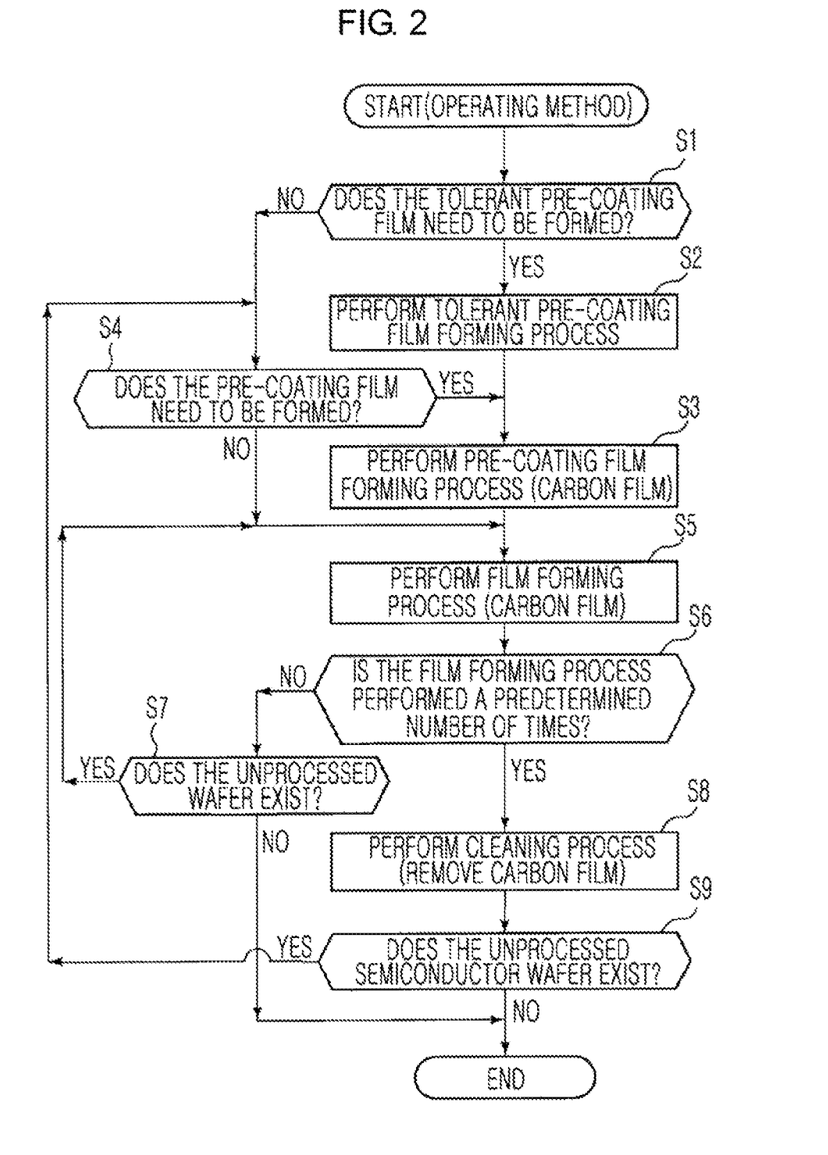
FIG. 2 is a flowchart illustrating a method of operating the film forming apparatus, according to an embodiment of the present invention.
Figure 3:
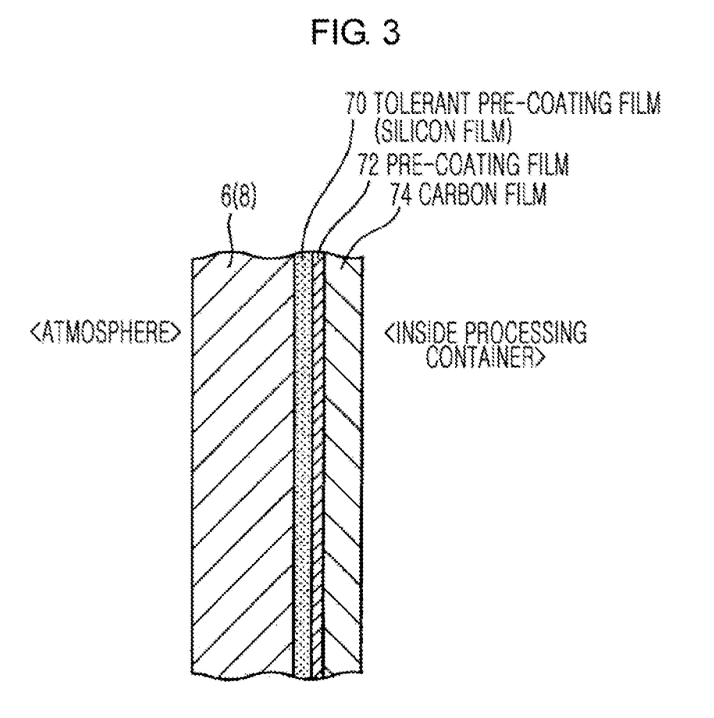
FIG. 3 is a magnified schematic view for showing thin films deposited on an inner surface of a processing container formed of a quartz material, according to an embodiment of the present invention.

Next, a method of operating the film forming apparatus 2 configured as above will now be described with reference to FIGS. 2 and 3. FIG. 2 is a flowchart illustrating a method of operating the film forming apparatus 2, according to an embodiment of the present invention, and FIG. 3 is a magnified schematic view showing an example of thin films deposited on an inner surface of the processing container 8 formed of a quartz material, according to an embodiment of the present invention. First, typical operations of the film forming apparatus 2 will now be briefly described. The wafer boat 22 holding the semiconductor wafer W is lowered downwards from inside the processing container 8, i.e., is in an unloaded state, and stands by in a loading area.

When a process is performed on the semiconductor wafer W, such as forming a carbon film on the semiconductor wafer W, a plurality of, for example, 50 to 100 sheets, unprocessed semiconductor wafers W are held by the wafer boat 22 in multi-stages. Also, when a tolerant pre-coating film is formed on an inner surface of the processing container 8 or a cleaning process is performed, the wafer boat 22 does not hold any semiconductor wafers W and is in an empty state. Also, the processing container 8 is maintained at a process temperature or lower, and the bottom opening of the manifold 18 is closed by the cover unit 28 after inserting, i.e., loading the wafer boat 22 into the processing container 8 by moving-up the wafer boat 22, thereby sealing the inside of the processing container 8.

Then, the inside of the processing container 8 is maintained at a predetermined process pressure while an inner temperature of the processing container 8 is increased by increasing power input to the heating unit 12 to stably maintain the processing container 8 at a predetermined process temperature. Next, a predetermined gas is introduced into the processing container 8 by using the gas introduction unit 40.

After the gas is introduced into the inner container 4, the introduced gas rises in the inner container 4, turns around at the ceiling portion, flows along a gap between the inner container 4 and the outer container 6, and is discharged to the outside of the processing container 8 by the vacuum exhaust system 52 through the exhaustion hole 50. Accordingly, a tolerant pre-coating film forming process, a carbon film forming process, a cleaning process, etc. are performed.

As described above, in order to form the tolerant pre-coating film, the tolerant pre-coating film forming gas, i.e., monosilane, is introduced from the tolerant pre-coating film forming gas supply system 42, in order to form the carbon film, the carbon film forming gas, i.e., ethylene is introduced from the carbon film forming gas supply system 44, the cleaning gas, for example, oxygen, is introduced from the cleaning gas supply system 46 when the cleaning process is performed, and the purge gas, for example, nitrogen, is introduced from the purge gas supply system 48 when, for example, a purge process is performed between each process.

Next, the method of operating the film forming apparatus 2, according to an embodiment of the present invention, will now be described in detail with reference to FIG. 2. The present invention is characterized in that the adhesion of the carbon film to the inner surface of the processing container 8 is improved and the tolerant pre-coating film having a tolerance to the cleaning gas for removing the carbon film is pre-formed. The tolerant pre-coating film is not required to be formed again since it remains even after the cleaning process of removing carbon in the processing container 8. Here, the expression "having a tolerance" does not mean that the tolerant is pre-coating film is not at all damaged by the cleaning gas for removing the carbon film, but has relatively less damage compared to the carbon film.

First, when the film forming apparatus 2 starts to operate, it is determined whether a tolerant pre-coating film needs to be formed (operation S1). The determination is performed based on whether a tolerant pre-coating film is already formed on an inner surface of the processing container 8. For example, if a special wet cleaning process or dry cleaning process for removing a tolerant pre-coating film in the processing container has been performed when a previous operation is finished, the tolerant pre-coating film needs to be formed again since the tolerant pre-coating film is removed via a tolerant pre-coating film cleaning process. In the same manner, when a new processing container 8 is used for the first time, the tolerant pre-coating film needs to be formed.

If a carbon film forming process has been performed within a permitted number of times in a previous operation, the tolerant pre-coating film has already been formed on the inner surface of the processing container 8, and thus, at this time, the tolerant pre-coating film does not need to be formed again.

Accordingly, if it is determined that the tolerant pre-coating film needs to be formed in operation S1 (YES in operation S1), a tolerant pre-coating film forming process (operation S2) is performed. During the tolerant pre-coating film forming process, as described above, the wafer boat 22 is accommodated in the processing container 8 and the wafer boat 22 is in an empty state in which a semiconductor wafers W is not held at all.

Then, monosilane, i.e., a silane-based is introduced as the tolerant pre-coating film forming gas at a predetermined flow rate into the processing container 8 from the tolerant pre-coating film forming gas supply system 42 of the gas introduction unit 40. Next, the inside of the processing container 8 is maintained at a predetermined process temperature and process pressure. Accordingly, a tolerant pre-coating film 70 (refer to FIG. 3) formed of a silicon film is deposited on the inner surface of the processing container 8 formed of a quartz material via a chemical vapor deposition (CVD) reaction as the monosilane is thermally decomposed. Here, the tolerant pre-coating film 70 is deposited on an entire surface of inner and outer sides of the inner container 4 that is a quartz product, an entire surface of the wafer boat 22 that is a quartz product, and an entire surface of the thermo-container 24 that is a quartz product. At this time, the silicon film that is the tolerant pre-coating film 70 is deposited in an amorphous or polycrystalline state.

Regarding process conditions at this time, the process temperature is within a range from 550 to 650° C. and the process pressure is within a range from 0.3 to 1.0 Torr. When the process temperature is lower than 550° C., the silicon film is not formed and when higher than 650° C., a film forming rate is too high, thereby generating surface roughness. Also, when the process pressure is lower than 0.3 Torr, a film forming speed is slow and thus not practical, and when higher than 1.0 Torr, particles are easily generated. The flow rate of the tolerant pre-coating film forming gas is within a range from 50 to 500 sccm.

Also, the tolerant pre-coating film 70 is formed to have a film thickness that is sufficiently thick to be within a range from 10 to 300 nm, and is formed to have a sufficient tolerance to a carbon film cleaning process described below, so as not to be removed. The film thickness of the tolerant pre-coating film 70 may be in a range from 10 to 100 nm. When the film thickness is less than 10 nm, the tolerant pre-coating film 70 is too thin and thus may be removed during the carbon film cleaning process described below, and when the film thickness is more than 300 nm, a time taken to form the tolerant pre-coating film 70 is too long, thereby deteriorating throughput of a wafer process.

Once the tolerant pre-coating film forming process described above is finished in operation S2, a pre-coating film forming process is performed in operation S3 to improve the reproducibility of a film forming process on the semiconductor wafer W, or the like. Alternatively, the pre-coating film forming process in operation S3 may be omitted. The pre-coating film is a thin film formed of a same material as a thin film to be formed on the surface of the semiconductor wafer W, and according to the forming of the pre-coating film, a carbon film is formed on the inner surface of the processing container 8 so as to improve the reproducibility of a wafer process or the like. An ethylene gas as the carbon film forming gas is introduced into the processing container 8 from the carbon film forming gas supply system 44 while the wafer boat 22 is in an empty state like in operation S2.

The ethylene gas is thermally decomposed and thus a pre-coating film 72 formed of a carbon film is deposited on the inner surface of the processing container 8. The pre-coating film 72 is deposited on the entire surface of the inner and outer sides of the inner container 4, the entire surface of the wafer boat 22, and the entire surface of the thermo-container 24, like the tolerant pre-coating film 70 described above. The tolerant pre-coating film forming process and the pre-coating film forming process are consecutively performed.

Regarding process conditions at this time, a process temperature is within a range from 600 to 800° C. and a process pressure is within a range from 5 to 400 Torr. A film thickness of the pre-coating film 72 is very thin, for example, about 50 nm. A flow rate of the carbon film forming gas is in a range from 100 to 2000 sccm. The carbon film that is the pre-coating film 72 is, for example, in an amorphous state. As described above, after the pre-coating film forming process in operation S3 is finished, the carbon film forming process in operation S5 is performed.

On the other hand, if it is determined that the tolerant pre-coating film does not need to be formed in operation S1 (NO in operation S1), it is determined whether a pre-coating film formed of a carbon film needs to be formed (operation S4). Here, for example, if a cleaning process of removing an unnecessary carbon film has been performed in the processing container 8 when the previous operation is finished, the pre-coating film 72 formed of a carbon film is also removed, and thus it is determined that the carbon film 72 needs to be formed (YES in operation S4) and the previous pre-coating film forming process is performed. At this time, the tolerant pre-coating film 70 having a tolerance to the carbon film cleaning gas remains.

If the pre-coating film has been already formed when the previous operation is finished, like a case in which any of the processes has not been performed after the carbon film forming process is performed, it is determined in operation S4 that the pre-coating film does not need to be formed (NO in operation S4), and then a carbon film forming process is performed in operation S5. Alternatively, when the pre-coating film 72 formed of a carbon film is not formed, operations S3 and S4 are also omitted.

In operation S5, the wafer boat 22 is lowered downwards to be unloaded once, a is plurality of unprocessed semiconductor wafers W for one-batch process are transferred to and held by the wafer boat 22, and then the wafer boat 22 is elevated to be loaded into the processing container 8. Like the pre-coating film forming process in operation S3, an ethylene gas as a carbon film forming gas is introduced into the processing container 8 from the carbon film forming gas supply system 44.

The ethylene gas is thermally decomposed while moving-up inside the inner container 4, contacts the semiconductor wafer W that is being rotated, and deposits a carbon film constituting, for example, an etching mask, on a surface of the semiconductor wafer W via a CVD reaction. At this time, a carbon film 74 is also deposited on the inner surface of the processing container 8 (refer to FIG. 3). Like the pre-coating film 72 described above, the carbon film 74 is deposited on the entire surface of the inner and outer sides of the inner container 4, the entire surface of the wafer boat 22, and the entire surface of the thermo-container 24.

Process conditions at this time are the same as the pre-coating film forming process in operation S4 described above, wherein a process temperature is within a range from 600 to 800° C. and a process pressure is from 5 to 400 Torr. The carbon film 74 is in, for example, an amorphous state. Also, a flow rate of the carbon film forming gas is in a range from 100 to 2000 scan Also, during operation S5, a pre-process may be performed on the semiconductor wafer W by flowing an aminosilane-based gas, such as diisopropylaminosilane (DIPAS), before flowing the carbon film forming gas.

As such, when the one-batch type film forming process is completed, it is determined whether the one-batch type film forming process is performed a predetermined number of times (operation S6). Here, the predetermined number of times n is equal to or more than one, and is arbitrarily set within a range where particles are not generated. The predetermined number of times n may be set by pre-determining a maximum value of a film thickness of a carbon film and adding up film thicknesses of carbon films deposited during the one-batch type film forming process until a point in time when the maximum value is reached.

The determining based on the predetermined number of times n is performed by counting the number of times the film forming process is performed after forming the tolerant pre-coating film 70. Here, if, after the film forming process is completed, the number of times the film forming processes are performed is lower than the predetermined number of times n (NO in operation S6), it is determined whether an unprocessed semiconductor wafer exists (operation S7). If it is determined that an unprocessed semiconductor wafer does not exist (NO in operation S7), the process is ended.

On the other hand, if it is determined that an unprocessed semiconductor wafer exists (YES in operation S7), the process returns back to the film forming process in operation S5 for depositing a carbon film to again perform the film forming process on the one-batch semiconductor wafers W. As such, the one-batch film forming process is repeatedly performed until the predetermined number of times n is reached, and at this time, the carbon film 74 deposited on the inner surface or the like of the processing container 8 is sequentially stacked. Then, when the performed film forming process reaches the predetermined number of times n (YES in operation S6), a cleaning process is performed in operation 58.

During the cleaning process, oxygen as the cleaning gas is supplied from the cleaning gas supply system 46 into the processing container 8 and, at this time, the wafer boat 22 in an empty state in which a semiconductor wafer is not held is accommodated in the processing container 8. Ozone or a mixture gas of ozone and oxygen may be used as the cleaning gas instead of oxygen. Accordingly, a carbon film deposited on an inner surface of the processing container 8 (including both surfaces of inner and outer sides of the inner container 4) or on a surface of the wafer boat 22 and a surface of the thermo-container 24, and the pre-coating film 72 formed of carbon are oxidized and removed. Here, since the tolerant pre-coating film 70 is tolerant to the cleaning gas for removing a carbon film, for example, an $O_2$ gas or ozone, and moreover, formed in a sufficient thickness, a surface of the tolerant pre-coating film 70 may be partially damaged, but the tolerant pre-coating film 70 remains hardly damaged, Regarding process conditions at this time, a process temperature is within a range from 600 to 800° C. when the cleaning gas is oxygen and within a range from 300 to 600° C. when the cleaning gas is ozone. A process pressure is within a range from 50 to 200 Torr when the cleaning gas is oxygen and is less than or equal to 10 Torr when the cleaning gas is ozone When the cleaning process in operation S8 is completed as such, it is determined whether an unprocessed semiconductor wafer exists (operation S9). If it is determined that an unprocessed semiconductor wafer exists (YES in operation S9), the process returns back to operation 84 where it is determined whether a pre-coating film formed of a carbon film needs to be formed, and each operation and each process are performed as described above Alternatively, when the process of forming the pre-coating film is omitted, the process returns back to the film forming process in operation S5. Here, when the predetermined number of times n is one ("n=1"), the cleaning process in operation S8 is performed whenever the one-batch film forming process is performed. If it is determined that an unprocessed semiconductor wafer does not exist (NO in operation S9), the process is ended.

As described above, since the tolerant pre-coating film 70 formed of, for example a silicon film, is formed on surfaces of members formed of a quartz material contacting the processing space S in the processing container 8, i.e., the inner surface of the outer container 6, the both surface of the inner and outer sides of the inner container 4, the entire surface of the wafer boat 22, and the entire surface of the thermo-container 24, before a carbon film is formed on the semiconductor wafer W, an adhesion of the carbon film 74 to the surfaces of the members formed of the quartz material that is a base material may be improved. Accordingly, in the process of forming the carbon film on the semiconductor wafer W, particles may be suppressed from being generated by detaching the carbon film 74 from the inner surface of the processing container 8 or the like.

Moreover, since the tolerant pre-coating film 70 has a tolerance to the cleaning gas for removing a carbon film, the tolerant pre-coating film 70 remains hardly damaged even when the cleaning process is performed on a carbon film. Thus, If the tolerant pre-coating film 70 is formed once initially when starting to operate the film forming apparatus, the tolerant pre-coating film 70 does not need to be formed whenever the cleaning process is performed on a carbon film.

As described above, according to the present invention, since the tolerant pre-coating film 70, which improves an adhesion of the carbon film 74 to the surface of the member contacting the processing space S in the processing container 8 and has a tolerance to the cleaning gas, is formed before the film forming process, the generation of particles may be suppressed by improving the adhesion of the carbon film 74 to the surface of the member contacting the processing space S in the processing container 8 while the tolerant pre-coating film 70 remains even when the cleaning process is performed on the carbon film 74.

Also, in the above embodiment, an amorphous or polycrystalline silicon film is used as the tolerant pre-coating film 70. However, alternatively, a silicon nitride (SiN) film may be used. In order to form the silicon nitride film, a silane-based gas, for example, dichlorosilane (DCS) or ammonia may be used as the tolerant pre-coating film forming gas. In this case, a process temperature is within a range from 600 to 800° C. and a process pressure is within a range from 0.2 to 0.5 Torr. Also, a film thickness of the silicon nitride film used as the tolerant pre-coating film 70 is the same as that of the silicon film above, and is in a range from 10 to 300 nm, preferably in a range from 10 to 100 nm.

Also, in the above embodiment, each member of the processing container 8, the wafer boat 22, and the thermo-container 24 is formed of quartz ($SiO_2$). However, alternatively, the present invention may be applied to cases when the members are formed of another material, for example, a ceramic material such as silicon carbide (SiC).

Also, in order to remove the tolerant pre-coating film 70 formed of a silicon film or silicon nitride film, a dry etching process using, for example, a fluorine-based gas, or a wet etching process using, for example, a hydrogen fluoride (HF)-based solution may be performed.

<Evaluation on Adhesion>

Figure 4:
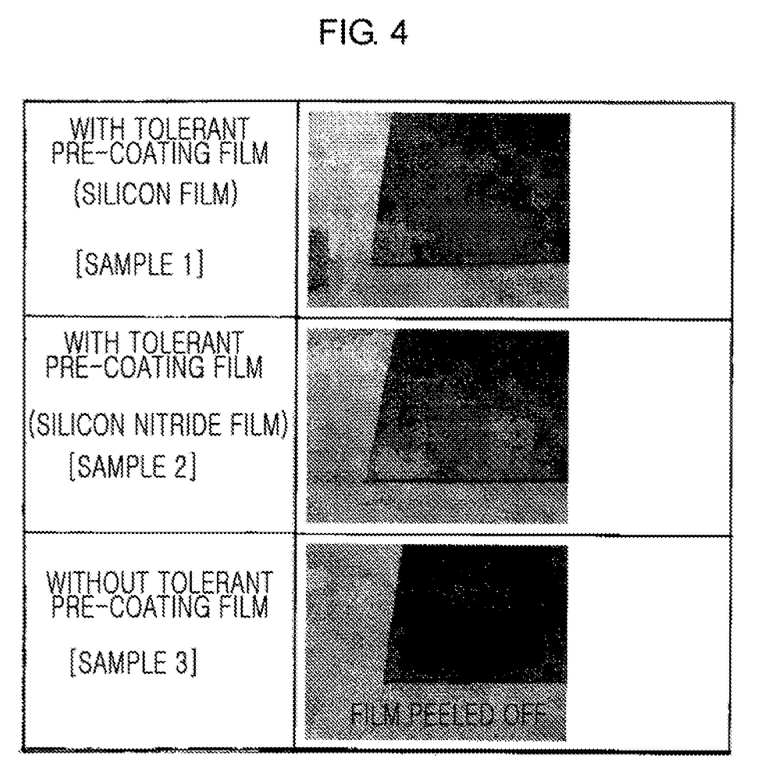
FIG. 4 is a set of photographs in place of diagrams for showing results of experiments on tolerant pre-coating films.

Experiments on tolerant pre-coating films formed according to the method of the present invention are performed, and thus, evaluation results will now be described. FIG. 4 is a set of photographs in place of diagrams for showing results of experiments on tolerant pre-coating films. Here, a sample 1 that forms a silicon film (polycrystalline state) as the tolerant pre-coating film 70 on a surface of a quartz base that is a base material and formed of a quartz material ($SiO_2$), a sample 2 that forms a silicon nitride film as the tolerant pre-coating film 70 on the surface of the quartz base, and a sample 3 that does not form the tolerant pre-coating film 70 on the surface of the quartz base at all were each prepared, a carbon film (amorphous state) was formed on a surface of each of the samples 1 through 3, and then an adhesive tape was adhered to and then peeled off from a surface of the carbon film.

At this time, a thickness of the tolerant pre-coating film 70 is 0.5 nm, in order to form the carbon film, ethylene was used as a carbon film forming gas and was flowed at a flow rate of 500 sccm. A process temperature was 800° C., a process pressure was 7.5 Torr, and the carbon film having a thickness of about 40 nm was formed. FIG. 4 shows states of surfaces when the adhesive tape is peeled off.

As shown in FIG. 4, in the samples 1 and 2 in which the tolerant pre-coating films were formed, adhesion was satisfactory without the carbon film being peeled off. In the sample 3 in which the tolerant pre-coating film was not formed, the carbon film was peeled off, and thus adhesion was not satisfactory. Also, when the cleaning process using the cleaning gas formed of oxygen, ozone, or a mixture gas thereof was performed on each of the samples 1 through 3 to remove the carbon film, the carbon film was removed in all the samples 1 through 3, but the tolerant pre-coating film 70 that is a base remained in an almost intact state although a surface thereof was partially slightly oxidized.

Also, as a silane-based gas used as the tolerant pre-coating film forming gas, one or more gases selected from the group consisting of dichlorosilane (DOS), hexachlorosilane (HCD), monosilane [$SiH_4$], disilane [$Si_2H_6$], hexamethyldisilazane (HMDS), tetrachlorosilane (TCS), disilylamine (DSA), trisilyiamine (TSA), bis(tertiary-butylamino)silane (BTBAS), and diisopropylaminosilane (DIPAS) may be used.

Also, as a hydrocarbon gas used as the carbon film forming gas, one or more gases selected from the group consisting of acetylene, ethylene, methane, ethane, propane, and butane may be used. Also, in the film forming apparatus, the processing container 8 having the double pipe structure is used. However, alternatively, the present invention may be applied to a film forming apparatus using a processing container having a single pipe structure.

Also, the semiconductor wafer is used as the object to be processed, wherein examples of the semiconductor wafer include a silicon substrate and semiconductor substrates of compounds such as gallium arsenide (GaAs), silicon carbide (SiC), and gallium nitride (GaN). Moreover, alternatively, the present invention may be applied to a glass substrate, a ceramic substrate, or the like used in a liquid crystal display apparatus.

According to the film forming apparatus and the method of operating the same of the present invention, the following excellent effects may be obtained:

In the method of operating a film forming apparatus, the method including forming a carbon film on surfaces of a plurality of objects held by a holding unit in a processing container and performing a cleaning process with a cleaning gas to remove an unnecessary carbon film adhered on a inside of the processing container, since the method further includes, before the forming of the carbon film, forming a tolerant pre-coating film which improves an adhesion of a carbon film to a surface of an member contacting a processing space in the processing container and has a tolerance to the cleaning gas, the generation of particles may be suppressed by improving the adhesion of the carbon film to the surface of the member contacting the processing space of the processing container and the tolerant pre-coating film may remain even when the cleaning process is performed on the carbon film.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of forming a carbon film on a substrate held by a substrate holding unit formed of a quartz material, the method comprising:
   introducing the substrate holding unit without the substrate to inside a processing container;
   forming a tolerant pre-coating film on a surface of the substrate holding unit;
   loading the substrate onto the substrate holding unit;
   forming the carbon film on the substrate, wherein the tolerant pre-coating film improves an adhesion of a carbon film being formed on the tolerant pre-coating film of the substrate holding unit to thereby prevent the carbon film of the substrate holding unit from peeling off;
   unloading the substrate from the substrate holding unit; and
   by supplying a cleaning gas to inside the processing container, cleaning the surface of the substrate holding unit to remove a carbon film being formed on the substrate holding unit, wherein the tolerant pre-coating film is a silicon nitride film or a silicon film, and the tolerant pre-coating film remains on the surface of the substrate holding unit after the cleaning.

2. The method of claim 1, wherein a thickness of the tolerant pre-coating film is in a range from 10 to 300 nm.

3. The method of claim 1, further comprising, between the forming of the tolerant pre-coating film and the loading of the substrate: forming a pre-coating film on the tolerant pre-coating film by flowing a material gas of the carbon film into the processing container.

4. The method of claim 1, wherein the cleaning of the surface of the substrate holding unit is performed after performing the forming of the carbon film one or more times.

5. The method of claim 1, wherein the processing container is formed of a quartz material,
   wherein, during the forming of the tolerant pre-coating film, the tolerant pre-coating film is formed on an inner side wall of the processing container; and
   wherein, during the forming of the carbon film on the substrate, the tolerant pre-coating film on the inner side wall improves an adhesion of a carbon film being formed on the tolerant pre-coating film of the inner side wall to thereby prevent the carbon film of the inner side wall from peeling off.

* * * * *